United States Patent [19]

Kobayashi et al.

[11] Patent Number: 5,458,763
[45] Date of Patent: Oct. 17, 1995

[54] METHOD FOR FORMING WIRING PATTERN

[75] Inventors: Shiro Kobayashi, Isehara; Toshinari Takada, Hadano; Haruo Akahoshi, Hitachi; Tomoyuki Miyazaki, Hadano; Kanji Yamamoto, Yokohama; all of Japan

[73] Assignee: Hitachi, Ltd., Tokyo, Japan

[21] Appl. No.: 151,167

[22] Filed: Nov. 12, 1993

[30] Foreign Application Priority Data

Nov. 12, 1992 [JP] Japan .................................. 4-301913

[51] Int. Cl.⁶ .............................. C25D 5/02; C25D 5/18; C25D 5/34; C25D 5/48
[52] U.S. Cl. .......................... 205/104; 205/118; 205/125; 205/170; 205/221; 205/223; 427/96; 427/97; 427/98
[58] Field of Search .................... 205/104, 118, 205/125, 170, 221, 223; 427/96, 98, 97; 174/250

[56] References Cited

FOREIGN PATENT DOCUMENTS 62-262489 11/1987 Japan .
63-69290 3/1988 Japan .
3-222392 10/1991 Japan .

*Primary Examiner*—John Niebling
*Assistant Examiner*—Edna Wong
*Attorney, Agent, or Firm*—Evenson, McKeown, Edwards & Lenahan

[57] ABSTRACT

A wiring pattern forming method in which side etch of a wiring pattern at the time of etching the substrate copper foil of a copper plating pattern is reduced to hold down an increase in line resistance, the wiring pattern forming method including the steps of: providing a plating resist pattern of which open area comprises a wiring pattern on the surface of a copper-clad laminate which is obtained by providing a copper foil on an insulating substrate; plating such open area with copper to form a copper plating pattern; then plating a crevice between the copper plating pattern and the plating resist pattern with a solder film by alternately repeating application of a current for a predetermined time period and suspension of the current application for a predetermined time period; and etching away the copper foil by using the solder film as an etching resist to form the wiring pattern.

8 Claims, 3 Drawing Sheets

METHOD FOR FORMING WIRING PATTERN

BACKGROUND OF THE INVENTION

The present invention relates to methods for forming a wiring pattern of a printed-wiring board and, more particularly, relates to a method for forming a wiring pattern of a printed-wiring board, suitable for accurately forming a fine pattern at a high density.

A method has conventionally been practiced for forming a wiring pattern of a printed-wiring board, in which an etching resist corresponding to a wiring pattern is provided on the surface of a copper-clad laminate which is obtained by providing a copper foil on a insulating substrate, to etch away those portions except the wiring pattern. In the above etching method, however, a cross section of the wiring pattern results in a trapezoidal shape where width of the bottom portion toward the substrate is relatively wider, since the copper film under the resist is subjected also to side etching. For this reason, it has been difficult to obtain a sufficient wiring cross sectional area as the width of the wiring becomes closer to the thickness of the wiring due to an increased density of the wiring. Further, there has been a problem that it is difficult to form a fine wiring with a high accuracy, since processing variance in etching is large.

For this reason, a pattern-plating method is used to accurately form such high density wiring. The pattern plating method is the method for forming a wiring pattern on an insulating substrate in which: a plating resist of which the open area comprises the wiring pattern is provided on the surface of a copper-clad laminate; the resist open area is plated with copper; the copper plating pattern surface is furthermore plated with solder; and, after peeling off said plating resist, the copper foil at the foundation is etched away by using the solder plating as the etching resist.

In the above pattern plating method, however, the copper plating pattern is subjected to side etch in a similar manner as the above etching method when etching the foundation copper foil, resulting in a problem of reduced wiring pattern width and reduced cross sectional area. Thus, various methods have been proposed of forming a solder plating film also on the side wall portion of the copper plating pattern to prevent side etching of the wiring pattern when etching the foundation copper foil. The known methods, for example, includes: a method, as disclosed in Japanese Patent Laid-Open Nos.62-262489 and 63-69290, in which photoresist development is repeated to form a crevice between the plating resist and the copper plating pattern and solder plating is then applied thereto; and a method, as disclosed in Japanese Patent Laid-Open No.3-222392, in which a boundary crevice between the copper plating pattern and the plating resist which occurs due to the difference in thermal expansion between the copper-clad laminate and the photoresist is used, so as to directly form a solder film on the side wall portion of the copper plating pattern by repeating in an alternating manner plating currents of a suitable level and a lower level.

Both of the above prior art respectively have the problems as follows.

In the method of repeating photoresist development, since exposure development is performed twice, deviation in dimensions tends to occur, its application in forming a high density, high precision wiring pattern is difficult, and an increase in number of steps is also unavoidable.

On the other hand, the method of directly forming a solder film on the copper plating pattern side wall by alternately repeating plating currents of a suitable level and a lower level by using the crevice at the boundary between the copper plating pattern and the plating resist is regarded as an excellent method in that number of steps is not increased and deviation in dimensions is smaller. This method is characterized in that, in order to balance consumption due to deposition with supply by means of diffusion of solder metal ion at the boundary crevice between the resist and the copper plating pattern at the time of solder plating, the steps are repeated of: applying a suitable current of a relatively low current density for a predetermined time period to deposit solder corresponding to the metal ion amount within the crevice on the copper plating pattern side wall portion; and then supplying the metal ion by means of diffusion into the crevice while applying a low level current that is 10% or less of the suitable current for a predetermined time period. In this method, however, since the current is continually applied, there is a problem that the solder metal ion causes a deposition on the copper plating pattern side wall in the vicinity of the crevice entrance, prior to its diffusion into the bottom portion of the crevice—not enough provision is made to uniformly cover the entire portion of the side wall with solder. As a result, side etching amount becomes larger at the portion of the copper plating pattern side wall toward the substrate, since it is not sufficiently covered with the solder film, resulting in a problem that wiring resistance is increased due to reduced cross sectional area of the pattern.

SUMMARY OF THE INVENTION

It is an object of the present invention to provide a wiring pattern forming method in which, when etching the substrate copper foil of the copper plating pattern, the side etch amount of the wiring pattern is reduced to control an increase in the wiring resistance.

To achieve the above object, a wiring pattern forming method is provided in accordance with the present invention, comprising the steps of: providing a plating resist of which open area comprises a wiring pattern on the surface of a copper-clad laminate obtained by providing a copper foil on an insulating substrate; forming a copper plating pattern by performing copper plating at the open area of said plating resist; providing plating of a metal having etch resisting property on the upper surface and the side wall portion of the copper plating pattern by repeating in an alternating manner a current application for a predetermined time period and suspension of said current application for a predetermined time period; then removing said plating resist; and etching away the copper foil using the etch-resisting metal plated on said copper plating pattern as an etching resist to form the wiring pattern on the insulating substrate.

The above current application and the suspension of the current application are preferably performed as follows. The time period for suspending the current application is set so that the ion concentration at the bottom portion of the crevice of the etch-resisting metal supplied within this time period by means of diffusion into the crevice from the crevice entrance between the copper plating pattern and the plating resist is at least higher than the amount of ion of the etch-resisting metal which has been consumed per unit volume of the crevice at the time of current application. For example, assuming: "$t_{off}$" as current suspension time; "$t_{on}$" as current application time; "Cs" as the ion concentration of the etch-resisting metal in the plating bath; "x" as the distance from the crevice entrance to the bottom of the crevice; "D" as diffusion coefficient of the ion of the etch-resisting metal; "i" as the current density; "N" as the electrochemical equivalent of the etch-resisting metal; "F" as the Faraday constant; and "d" as the width of the crevice, the suspension time of the current application is set to satisfy the following formula (1):

$$C_s \left\{ 1 - \frac{2}{\sqrt{\pi}} \int_0^{\frac{x}{2\sqrt{Dt_{off}}}} \exp(-y^2) dy \right\} \geq iNt_{on} F\delta \quad (1)$$

where $y = \frac{x}{2\sqrt{Dt_{off}}}$

Further, the current application is preferably repeated such that the amount of the etch-resisting metal to be deposited on the copper plating pattern side wall is at least greater than the amount of such metal required in filling the crevice. For example, supposing: "i" as current density; "$t_{on}$" as the current application time; "N" as electrochemical equivalent of the etch-resisting metal; "F" as the Faraday constant; "δ" as the width of the crevice; and "ρ" as the density of the etch-resisting metal, it is preferably repeated "n" times to satisfy the following conditions:

$$nit_{on}(N/F) \geq \rho\delta \quad (2)$$

For ease of explanation, solder is used as the etch-resisting metal in the following description. In order to prevent side etch of the wiring pattern at the time of etching the foundation copper foil, it is necessary to cover not only the upper surface of the copper plating pattern but also the entire side wall portion thereof with solder plating film. A crevice of 0.5~2 μm wide occurring due to difference in thermal expansion between the copper-clad laminate and the photoresist film exists at the boundary between the wiring pattern and the plating resist. If it is possible to use such boundary crevice to uniformly plate solder directly onto the side wall portion of the copper plating pattern, side etch at the time of etching may be prevented without increasing the number of processing steps. Thus, the conditions for uniformly plating the crevice portion with solder has been investigated in detail. It has been found as a result that a solder film may be formed uniformly over the entire surface of the copper plating pattern side wall by repeating, when performing solder plating, the steps in which: the current application is suspended for a time period during which required and sufficient concentration of solder metal ion is diffused into the bottom portion of the boundary crevice toward the solder plating bath between the copper plating pattern and the plating resist; and then a current of an electricity quantity corresponding to the amount of the solder metal ion at the crevice bottom supplied by means of diffusion at the time of suspension of current application is applied for a predetermined time period.

Preferable conditions in such case will furthermore be described in the following. Since the width of the boundary crevice is extremely narrow to be about 0.5~2 μm, the amount of the solder metal ion existing therein is also extremely small. Thus, when the consumption rate of the solder metal ion within the crevice at the time of current application is analyzed, the concentration C (g/l) of the solder metal ion is reduced in accordance with formula (4).

$$C = C_o - (itN/F\delta) \times 100000 \quad (4)$$

where: Co is the initial concentration (g/l) of the solder metal ion within the crevice; i is current density (A/dm²); t is current application time (s); N is the electrochemical equivalent of the solder metal ion (77 g/mol for a plating solution having the composition of 60 wt % Sn-40 wt % Pb); F is the Faraday constant 96500 C/mol; and δ is the width (μm) of the crevice.

FIG. 1 shows the result of computation based on formula (4) of change with elapse of time of the solder metal ion concentration within the crevice in the case where the width of the crevice is 1 μm and a plating solution of 25 g/l of the composition of 60 wt % Sn-40 wt % Pb which is a typical plating solution composition is used as the initial concentration. As shown in FIG. 1, if a current of a usual current density is applied, the solder metal ion within the crevice will be consumed in a very short time period. Accordingly, if a current is simply applied, only a small amount of solder is deposited on the copper plating pattern side wall during the very initial period thereof and most of the electricity quantity caused to flow is consumed for deposition of solder on the upper surface portion of the copper plating pattern. From this, it is necessary to supply solder metal ion corresponding to the amount of conducted current into the crevice in order to deposit a thick solder film on the copper plating pattern side wall.

In order to supply the solder metal ion into the crevice, the solder metal ion must be diffused from the plating bath into the crevice. The rate of diffusion of ion from the bulk solution into the crevice conforms to Fick's second law and becomes a function of distance x from the crevice entrance and diffusion time, i.e., of the current suspension time "$t_{off}$" as represented by formula (5), if the ion concentration Cs in the bulk solution is determined.

$$C = C_s \left\{ 1 - \frac{2}{\sqrt{\pi}} \int_0^{\frac{x}{2\sqrt{Dt_{off}}}} \exp(-y^2) dy \right\} \quad (5)$$

$$\frac{2}{\sqrt{\pi}} \int_0^{\frac{x}{2\sqrt{Dt_{off}}}} \exp(-y^2) dy \quad (5')$$

where D is a diffusion coefficient and the integration represented by formula (5') is a value referred to as probability integration. It is seen from formula (5) that, although the ion concentration within the crevice may be increased by increasing the ion concentration Cs in the bulk solution, the metal ion concentration in the solder plating bath is suitably set to the range of 20~ 30 g/l considering the uniform electrodeposition characteristic of the plating film.

FIG. 2 shows change with elapse of time of the ion concentration distribution within the crevice obtained from formula (5) with respect to the case where the concentration of the bulk solution is 25 g/l which is a typical composition for a solder plating solution and the diffusion coefficient is $2 \times 10^{-5}$ cm²/s which is an average value for metal ions. According to FIG. 2, the rate by which the metal ion is diffused into the crevice is rather slow comparing to the rate by which the metal ion is consumed in plating as shown in FIG. 1. While the concentration in the vicinity of the crevice entrance is increased in a short period of time, it requires a rather long time period for the ion concentration at the portion deeper into the crevice to achieve an equivalent level as the concentration in the bulk solution. For example, it takes about 20 s for the ion concentration at the position of 70 μm deep in the crevice to achieve 80% of the concentration in the bulk solution. From this analyzing result, it has been found that, in order to resupply the metal ion consumed within the crevice, it is necessary to provide a sufficient time period for the diffusion into the crevice.

Among methods considered for causing a diffusion, there are a method in which operation is repeated of intermittently suspending application of current after applying a current for a predetermined time period to resupply by means of diffusion the ion amount consumed at the time of the application of current and a method in which resupply of the consumed amount is continued by means of diffusion while causing a small current to flow correspondingly to the ion amount being resupplied. The former method, though requiring an exclusive pulse power source or switching circuit to apply a current in pulse waveform, is capable of causing solder plating to be uniformly deposited on the copper plating pattern side wall if time is caused to elapse until the metal ion at the crevice bottom attains a sufficient concentration. In the latter method, however, the current density must be set to a very low level. Since, at a lower current density, crystal of the solder metal grows larger at a slower rate, the crystal surface becomes coarse where only a solder film with a large defect can be obtained and deposition tends to be caused in the vicinity of the crevice entrance where it is difficult to obtain a solder film having a uniform thickness. Thus, the former method is superior.

In order to efficiently plate the entire surface of the copper plating pattern side wall uniformly with a solder film, it suffices to repeat the step of suspending current application until the solder metal ion concentration at the crevice bottom attains a concentration corresponding to the solder metal ion amount to be consumed at the time of current application and the step of applying a current of the electricity quantity corresponding to the solder metal ion concentration at the crevice bottom. Thus, required conditions for achieving such plating process are analyzed as follows. The metal ion concentration at the crevice bottom during diffusion process is obtained from formula (5); it is substituted for the initial concentration Co of formula (4); and the condition for the left side of formula (4) to be 0, i.e., for all the metal ion at the crevice bottom to be consumed is obtained to result the following formula (6):

$$C_s \left\{ 1 - \frac{2}{\sqrt{\pi}} \int_0^{\frac{x}{2\sqrt{Dt_{off}}}} \exp(-y^2) dy \right\} = iNt_{on} Fd \quad (6)$$

where $t_{off}$ represents suspension time of current application and ton is the current application time. Thus, it is necessary to select solder metal ion concentration Cs in the plating bath, current suspension time $t_{off}$ and current application time $t_{on}$ that the solder metal ion concentration at the crevice bottom supplied by means of diffusion during suspension of current application which is indicated by the left side of the formula (6) is at least greater than the solder metal ion amount to be consumed per unit volume of the crevice at the time of current application which is indicated by the left side thereof.

FIG. 3 shows the relation between current suspension time $t_{off}$ and current application time $t_{on}$ obtained by using formula (6) with respect to the case where the plating solution composition is a bath of 60 wt % Sn-40 wt % Pb at a metal ion concentration of 25 g/l, the current density is 1A/dm$^2$ and the diffusion coefficient is $2 \times 10^{-5}$cm$^2$/s. If a longer application time or a shorter suspension time than this chart is selected, deficiency of the metal ion concentration at the crevice bottom occurs and a plating film having a uniform thickness cannot be obtained. To the contrary, under the condition of a shorter application time or a longer suspension time than this chart, it is possible to form a uniform plating film over the entire surface of the pattern side wall, since the metal ion concentration at the crevice bottom may be maintained to a required and sufficient level.

Although a uniform plating film may be formed over the entire surface of the pattern side wall by plating under the conditions of current application obtained as the above, the plating film does not function as an etching resist and side etch cannot be prevented if it is not thick enough. Thus, side etch may be adequately prevented by filling the crevice of 0.5~2 μm at the boundary between the copper plating pattern and the resist with a solder film. The conditions for filling the boundary crevice with a solder film are analyzed to result the following formula (7):

$$nit_{on}(N/F) = \rho\delta \quad (7)$$

where n is the number of times of current application and ρ is the density of solder. Thus, the crevice may be filled with solder by repeating current application process so that the amount of solder to be deposited on the pattern side wall by current application indicated by the left side of formula (7) is equal to or greater than the amount of solder necessary for filling the crevice by the side wall portion indicated by the right side thereof.

If, as the above, it is possible to form a thick solder film uniformly over the entire surface of the copper plating pattern side wall, side etch of the copper plating pattern may be prevented at the time of etching of the foundation copper foil. Since, however, the solder film is deposited only on the boundary between the the copper plating pattern and the resist, the wiring pattern is subjected to etching not from the copper plating pattern side wall portion but from the side of the foundation copper foil as the substrate copper foil becomes thinner. Thus, even if the solder film may be formed uniformly over the entire surface of the pattern side wall, reduction in the wiring pattern cross sectional area due to etching cannot be avoided.

The cross section of the wiring pattern after etching has the shape as shown FIG. 4, where it is etched from the side of the substrate copper foil in the manner of a sector. The following formulas expressing relation hold for dimension and shape of the cross section of the etched portion. The etch height H from the substrate is related to etch rate v (thickness etched in a unit time period), etch time τ, and thickness d of the foundation copper foil as indicated by formula (8), and width B at the pattern bottom portion is related to the overall pattern width W as indicated by formula (9).

$$H = V\tau + d \quad (8)$$

$$B = W - 2v\tau \quad (9)$$

However, if forming of solder film over the copper plating pattern side wall is not complete, both the etch height and the width at the pattern bottom become larger than the values regulated by formulas (8), (9). The relation of formula (3) is obtained from formulas (8), (9), where, if the entire surface of the copper plating pattern side wall is plated uniformly with a solder film, the shape of the etched portion is regulated only by the initial shape of the copper plating pattern before etch processing and the thickness of the foundation copper foil.

$$H = (W-B)/2 + d \quad (3)$$

In order to plate the entire surface of the copper plating pattern side wall uniformly with a solder film, it is necessary to promote diffusion of solder plating solution into the boundary crevice between the copper plating pattern and the resist. Among the methods considered for promoting diffusion, there are a method in which water or a solution is previously different into the crevice prior to plating and a method in which a surface-active agent is added to the plating solution to improve the wetting characteristic of the crevice wall. Although number of processing steps is not increased with the latter method, selection of the surface-active agent is difficult. With the former method, on the other hand, the solder plating solution tends to diffuse uniformly into the crevice if a water film is previously formed within the crevice. As an actual method for forming a water film within the crevice, there is an excellent method, in which the board to be processed is immersed into a boiling water as a pretreatment processing and is then quenched so that air within the crevice is removed to be replaced by water.

When the board subjected to the above pretreatment is plated with solder under the conditions of limited current and time period, it is possible to form a solder film uniformly over the pattern side wall, whereby etch amount at the time etching may be significantly reduced.

BRIEF DESCRIPTION OF THE DRAWING

FIG. 5 shows fabrication process of the wiring pattern forming method according to an embodiment of the present invention, in which:

DESCRIPTION OF THE PREFERRED EMBODIMENT

Figure 1:
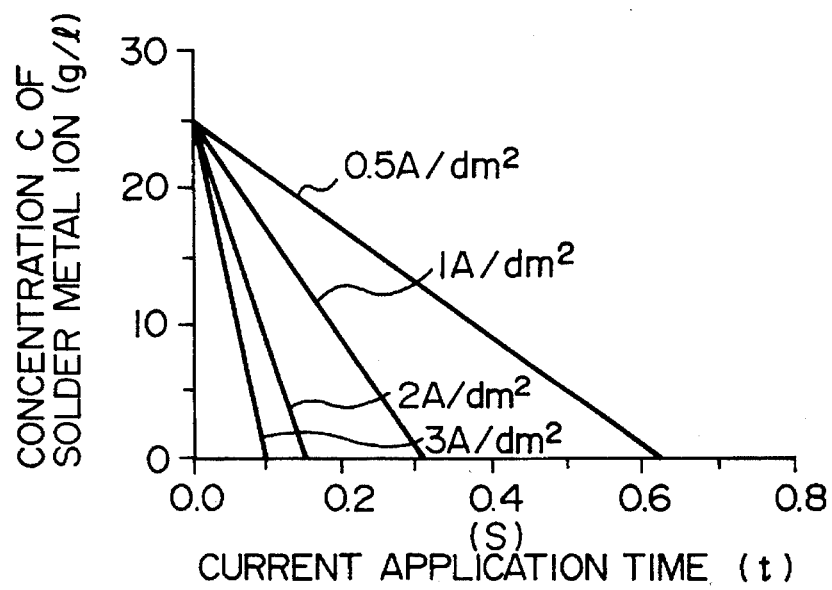
FIG. 1 shows change with elapse of time of the solder metal ion concentration within the boundary crevice between the plating resist and the copper plating pattern at the time of application of a current.
Figure 2:
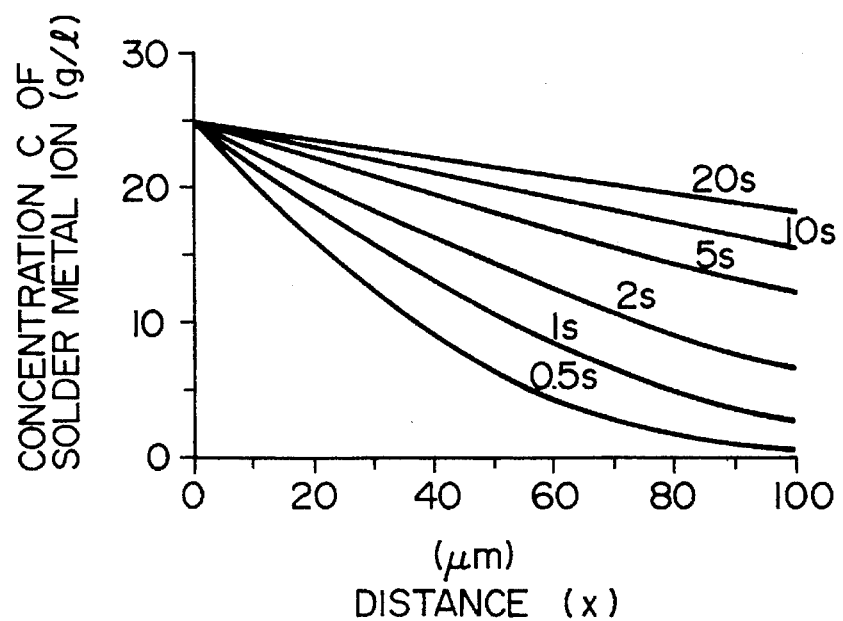
FIG. 2 shows distribution of solder metal ion concentration within the boundary crevice during suspension of current.
Figure 3:
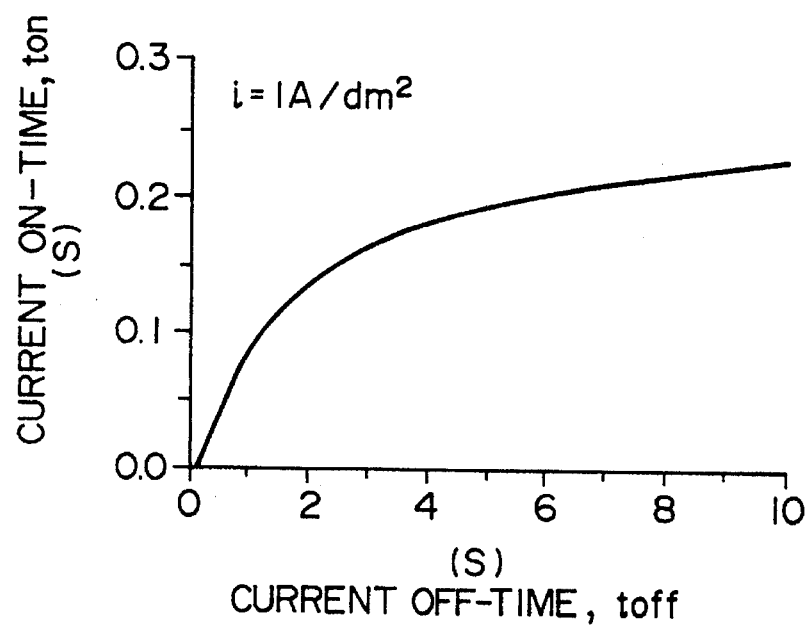
FIG. 3 is a chart showing a suitable range of current application time and suspension time according to the present invention.
Figure 4:
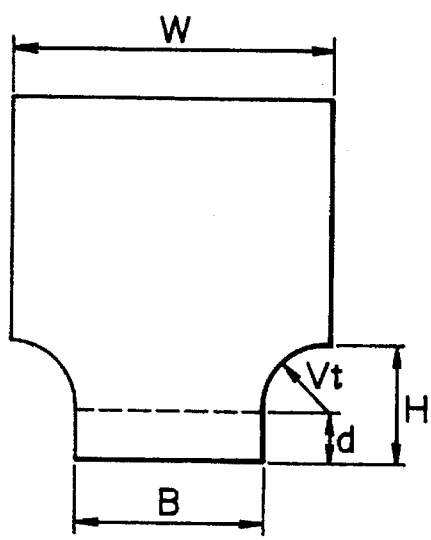
FIG. 4 is a cross-sectional view of a wiring pattern according to an embodiment of the present invention.
Figure 5A:
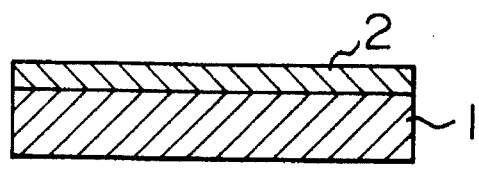
FIG. 5A is a cross-sectional view of a copper-clad laminate.
Figure 5B:
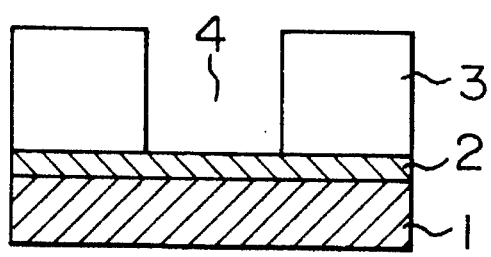
FIG. 5B is a cross-sectional view showing the state of forming a resist pattern on the copper-clad laminate.
Figure 5E:
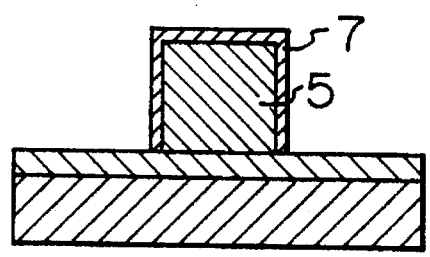
FIG. 5E is a cross-sectional view with the resist film being removed.
Figure 5C:
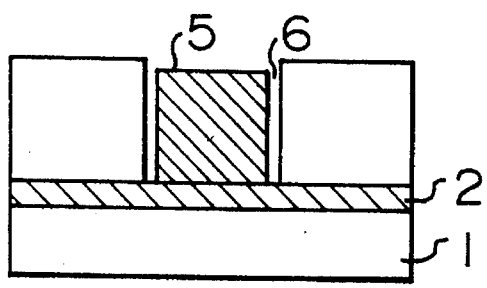
FIG. 5C is a cross-sectional view showing the sate of forming a copper plating pattern at the open area of the resist pattern.
Figure 5F:
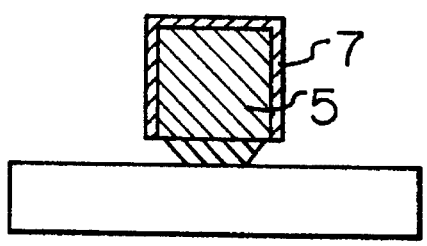
FIG. 5F is a cross-sectional view showing the state after etching.
Figure 5D:
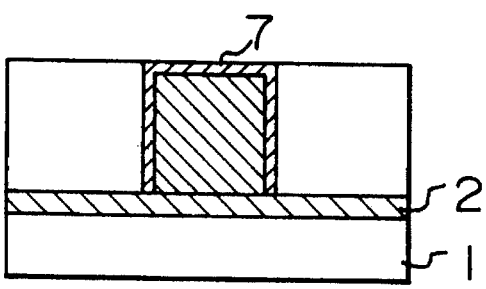
FIG. 5D is a cross-sectional view showing the state of forming a solder film on the copper plating pattern.
Figure 5G:
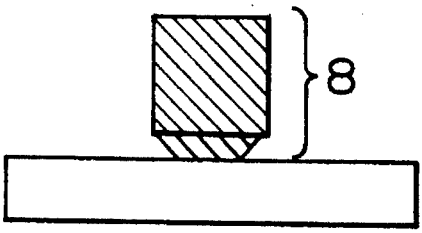
FIG. 5G is a cross-sectional view showing the state of forming an independent copper wiring pattern by removing the solder film.

An embodiment of the present invention will now be described by way of the drawing and a table. FIGS. 5A–5G shows the shapes of substrate cross section in each processing step of the wiring pattern forming method according to the present invention. FIG. 5A shows a cross section of a copper-clad laminate. A copper foil 2 having a uniform thickness is formed on an insulating substrate 1. In FIG. 5B, the state is shown, where a dry photoresist film is laminated on the surface of the copper-clad laminate and a pattern image is developed after exposure by way of a photomask to form a resist pattern 3. Thereafter, as shown in FIG. 5C, a copper plating pattern 5 is formed by means of electroplating or chemical plating at a resist pattern open area 4. Since there is a difference in thermal expansion rate between the copper-clad laminate and the resist film, a crevice 6 of 0.5–2 µm occurs at the boundary surface between the resist pattern 3 and the copper plating pattern 5 after effecting plating. Solder plating is effected under the conditions satisfying formulas (1) and (2) to form a solder film 7 on the upper surface and the side wall portion of the above copper plating pattern 5 (FIG. 5D). After the solder plating, the above resist film is removed to obtain the state as shown in FIG. 5E. After removing of the resist, when the copper foil 2 is subjected to wet etch by means of an etchant—while side etch is not effected from the side wall portion of the copper plating pattern—since the copper plating pattern is slightly dissolved from the side of the substrate copper foil as the copper foil 2 becomes thinner, the shape after etching becomes as shown in FIG. 5F and detail of dimensions is as shown in FIG. 4. Finally, the above solder film 7 may be removed as shown in FIG. 5G to form an independent copper wiring pattern 8 on the substrate.

Table 1 shows etch height of the copper wiring pattern after the process in which: a copper-clad laminate of which the thickness of the copper foil is 12 µm was used; processing as shown in FIGS. 5A–5C was effected to form a copper plating pattern of which both the overall width and the overall thickness was 70 µm; and then solder plating was effected under various conditions according to the present invention and the above copper foil was etched away. It should be noted that the average width between the resist and the copper plating pattern was 1 µm. The composition of the solder film is 60 wt %Sn-40 wt %Pb. Note that Sn may be used instead of the solder.

TABLE 1

| | Current density (A/dm$^2$) | Application time $t_{on}$ (s) | Suspension time $t_{off}$ (s) | Number of application n | Boil water treatment | Etch height H (µm) |
|---|---|---|---|---|---|---|
| Example 1 | 1 | 0.1 | 2 | 1800 | Effected | 27 |
| Example 2 | 1 | 0.1 | 4 | 1800 | Effected | 28 |
| Example 3 | 1 | 0.2 | 6 | 900 | Effected | 26 |
| Example 4 | 1 | 0.2 | 2 | 900 | Effected | 46 |
| Example 5 | 1 | 0.2 | 6 | 90 | Effected | 53 |
| Example 6 | 1 | 0.2 | 6 | 900 | Not effected | 61 |
| Conventional Example 1 | 1 | Continuous conduction of DC for 180 sec | | | Effected | 69 |
| Conventional | Repeated 9 times, 1 A/dm$^2$ 20 s | | | | Effected | 65 |

TABLE 1-continued

| | Current density (A/dm$^2$) | Application time $t_{on}$ (s) | Suspension time $t_{off}$ (s) | Number of application n | Boil water treatment | Etch height H (μm) |
|---|---|---|---|---|---|---|
| Example 2 | and 0.01 A/dm$^2$ 10 s | | | | | |

In the case of simply applying a current as DC as indicated by Conventional Example 1 and the case of alternately applying a high level current and a low level current as indicated by Conventional Example 2, side etch takes place to increase the etch height and to reduce the pattern cross-sectional area. On the other hand, in Examples 1, 2, 3 of the present invention, since etching is effected from the side of foundation copper foil, etch height is smaller and reduction in cross-sectional area is very small, and the etch height well conforms to the calculated value by formula (8). In Example 4 where relation between application time and suspension time does not satisfy formula (1) and in Example 5 where number of times of application is small and does not satisfy formula (2), etch height becomes somewhat larger comparing to Examples 1, 2, 3. Also, in Example 6 where boiling water treatment is not effected as a pretreatment of solder plating, the amount of side etch becomes larger, because plating over the copper plating side wall portion is not uniform. However, these Examples 4, 5, 6, too, indicate their respective results that are superior to those of Conventional Examples 1, 2.

We claim:

1. A method for forming a wiring pattern on an insulating substrate, comprising the steps of:
   providing a plating resist of which open area comprises a wiring pattern on the surface of a copper-clad laminate formed by providing a copper foil on an insulating substrate;
   plating the open area of the plating resist with copper to form a copper plating pattern;
   plating an upper surface and side wall of said copper plating pattern along a crevice formed between the plating resist and the copper plating pattern with a metal having etch resisting property;
   removing said plating resist; and
   etching away said copper foil by using the etch resisting metal plated on said copper plating pattern as an etching resist;
   wherein the step of plating with said etch resisting metal is effected by alternately repeating application of a current and suspension of said current application.

2. A method for forming a wiring pattern according to claim 1, wherein said suspension in the step of plating with said etch resisting metal is set such that an ion concentration of the etch resisting metal supplied into a crevice by means of diffusion from a crevice entrance between said copper plating pattern and said plating resist at a bottom portion of the crevice during the time period of said suspension of current application is at least greater than the amount of ion of the etch resisting metal to be consumed per unit volume of said crevice at the time of said current application.

3. A method for forming a wiring pattern according to claim 1, wherein said current application and said suspension of current application are set to satisfy the conditions of:

$$Cs \left\{ 1 - \frac{2}{\sqrt{\pi}} \int_0^{\frac{x}{2\sqrt{Dt_{off}}}} \exp(-y^2) dy \right\} \geq iNt_{on}/F\delta \quad (1)$$

where $y = \frac{x}{2\sqrt{Dt_{off}}}$ and where $t_{off}$ represents current suspension time; $t_{on}$ represents current application time; Cs represents the ion concentration of the etch-resisting metal in a plating bath; x represents the distance from the crevice entrance to the bottom of the crevice; D represents diffusion coefficient of the ion of the etch-resisting metal; i represents the current density; N represents the electrochemical equivalent of the etch-resisting metal; F represents the Faraday constant; and d represents the width of the crevice.

4. A method for forming a wiring pattern according to claim 2, wherein said current application is repeated such that the amount of the etch resisting metal to be deposited on said copper plating pattern side wall is at least greater than the amount of the etch resisting metal which is necessary to fill the crevice.

5. A method for forming a wiring pattern according to claim 3, wherein said current application is repeated for n times to satisfy the conditions of:

$$nit_{on}(N/F) \geq \rho\delta \quad (2)$$

where i represents current density; $t_{on}$ represents the current application time; N represents the electrochemical equivalent of the etch-resisting metal; F represents the Faraday constant; δ represents the width of the crevice; and r represents the density of the etch-resisting metal.

6. A method for forming a wiring pattern according to claim 1, further comprising the step of immersing the insulating substrate having said plating resist and said copper plating pattern provided thereon into boiling water and then quenching it prior to the step of plating with said etch resisting metal and after the step of forming said copper plating pattern.

7. A method for forming a wiring pattern according to claim 1, wherein said metal having etch resisting property is solder.

8. A method for forming a wiring pattern according to claim 1, wherein said metal having etch resisting property is tin.

* * * * *